(12) United States Patent
Toraichi et al.

(10) Patent No.: US 6,639,535 B1
(45) Date of Patent: *Oct. 28, 2003

(54) DIGITAL TO ANALOG CONVERTER USING B SPLINE FUNCTION

(75) Inventors: Kazuo Toraichi, Sayama (JP); Kouichi Wada, Tsukuba (JP)

(73) Assignee: Niigata Seimitsu Co.., Ltd., Niigata (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/623,073

(22) PCT Filed: Feb. 23, 1999

(86) PCT No.: PCT/JP99/00815

§ 371 (c)(1),
(2), (4) Date: Oct. 25, 2000

(87) PCT Pub. No.: WO99/44290

PCT Pub. Date: Sep. 2, 1999

(30) Foreign Application Priority Data

Feb. 26, 1998 (JP) .............................................. 10-62132

(51) Int. Cl.[7] .............................................. H03M 1/66
(52) U.S. Cl. ...................................................... 341/147
(58) Field of Search ................................ 341/147, 144; 315/368; 356/445; 372/34; 708/313, 315, 322, 8; 324/76.21; 375/296; 84/462

(56) References Cited

U.S. PATENT DOCUMENTS 4,245,541 A     1/1981  Deutsch
5,732,107 A  *  3/1998  Phillips et al. ............... 375/296
5,859,787 A  *  1/1999  Wang et al. .................. 708/315
6,392,398 B1 *  5/2002  Toraichi et al. .......... 324/76.21
6,411,238 B1 *  6/2002  Koyanagi et al. ............ 341/144

FOREIGN PATENT DOCUMENTS

| EP | 497060   | * | 8/1992 |
| JP | 1-117426 |   | 5/1989 |
| JP | 3-13007  |   | 1/1991 |
| JP | 4-61509  |   | 2/1992 |
| WO | 9103105  |   | 3/1991 |

* cited by examiner

Primary Examiner—Patrick Wamsley
(74) Attorney, Agent, or Firm—Dellett and Walters

(57) ABSTRACT

A digital-analog converter for producing less distorted output waveforms without the need for an increase in the operating speed of components. A D/A converter 1 comprises a memory 10, an address counter 12, a B spline function generation circuit 14, four sampling function generation circuits 16, three delay circuits 18, four amplifiers 20, and three adding circuits 22, 24 and 26. Four items of digital data supplied one after another in the predetermined time interval T are stored in the memory 10. The gain of each of the four amplifiers 20 is set according to the corresponding digital data. The four sampling function generation circuits 16 generate signal waveforms of the sampling function, which appear individually in points a time T away from one another. The signal waveforms are amplified in the amplifier 20 and added to produce an analog signal associated with the interpolation value.

12 Claims, 11 Drawing Sheets

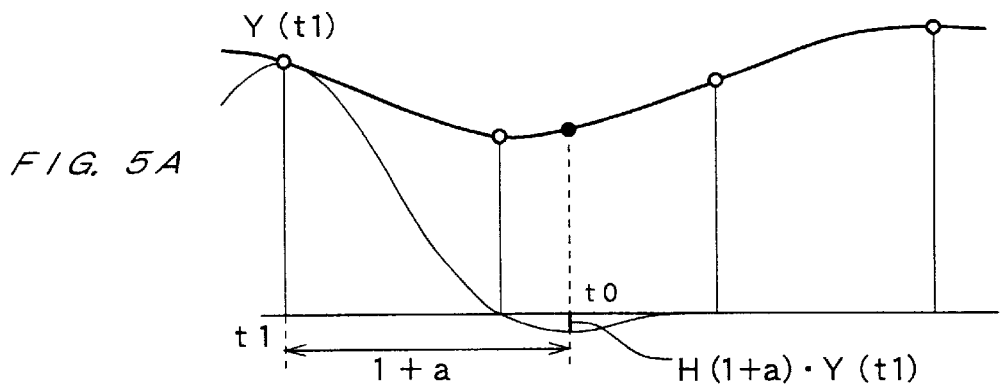
F I G. 5A
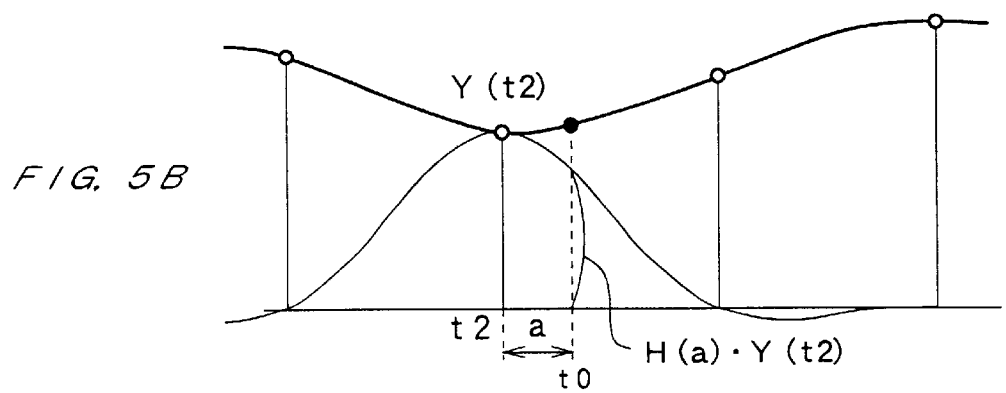
F I G. 5B
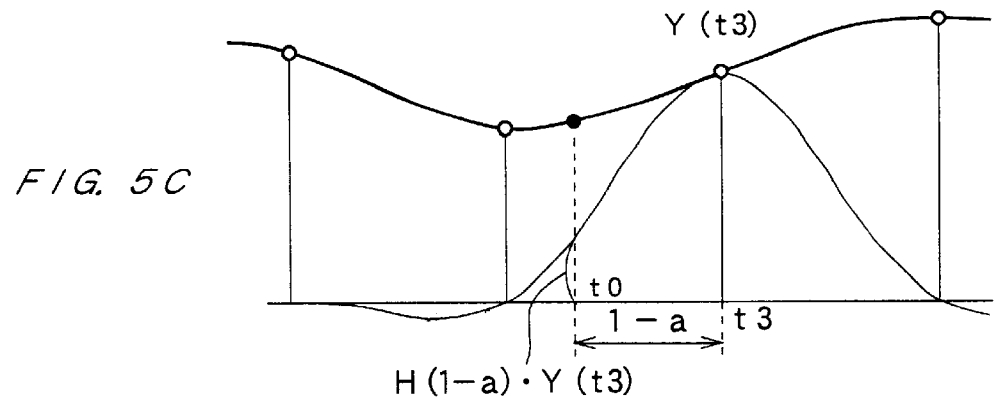
F I G. 5C
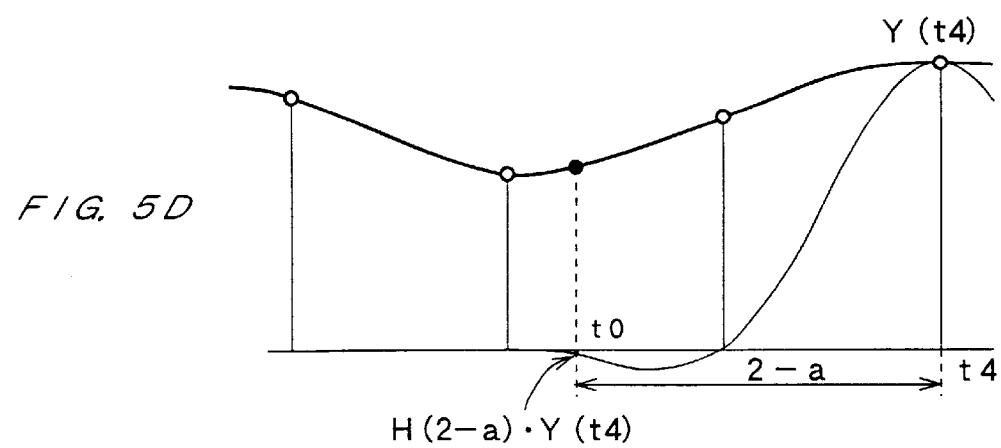
F I G. 5D

FIG. 12
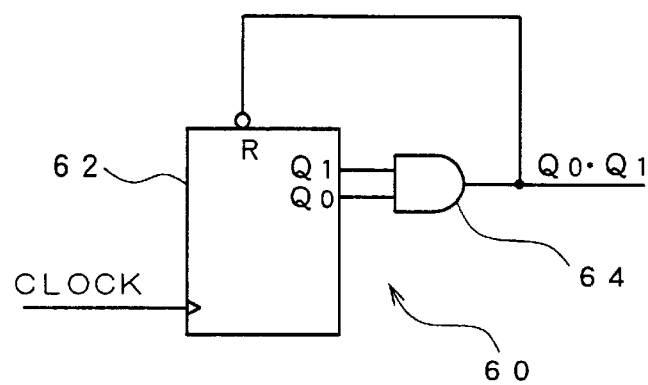
FIG. 13A CLOCK
FIG. 13B Q0
FIG. 13C Q1
FIG. 13D Q0·Q1
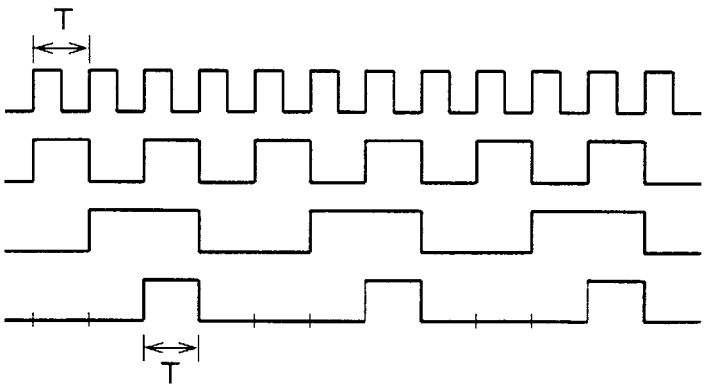

F/G. 14
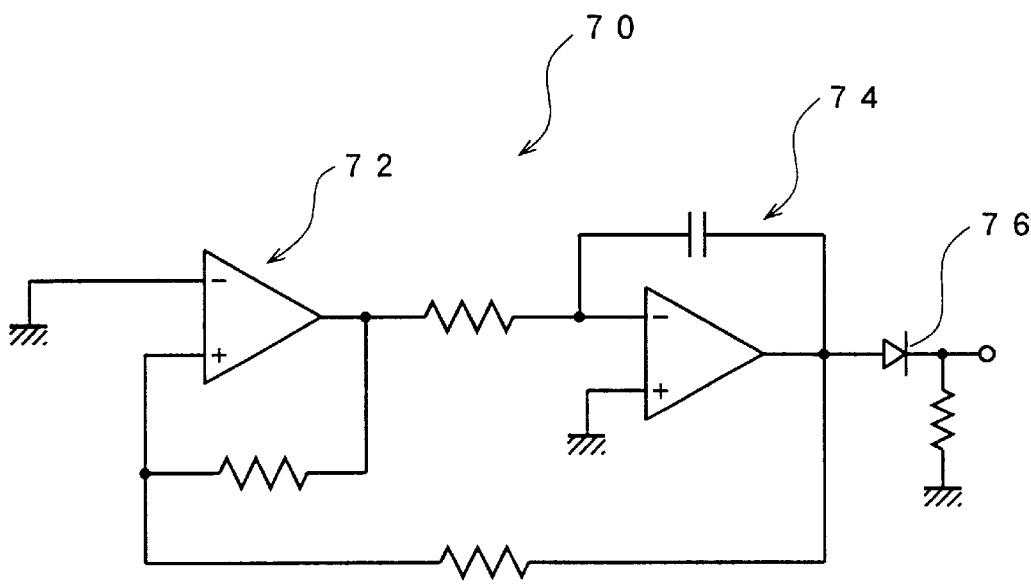
F/G. 15A
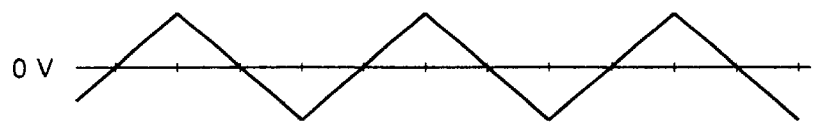
F/G. 15B
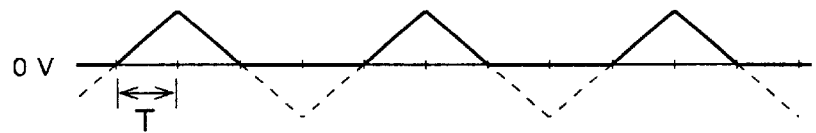

DIGITAL TO ANALOG CONVERTER USING B SPLINE FUNCTION

BACKGROUND OF THE INVENTION

1. Field of the Invention

The present invention relates to a digital-analog converter for converting discrete digital data into continuous analog signals. In this specification, it is assumed that a case where function values have finite values except zero in a local region and become zero in regions different from the region is called a "local support."

2. Description of the Prior Art

In recent digital audio devices, for example, a CD (compact disk) player, etc., D/A (digital-analog) converter applying an over sampling technology to obtain continuous analog voice signals from the discrete music data(digital data). Such a D/A converter generally uses a digital filter to raise a pseudo sampling frequency by interpolating input digital data, and outputs smooth analog voice signals by passing each interpolation value through a low-pass filter after generating a staircase signal waveform with each interpolation value held by the sample holding circuit.

A data interpolating process is performed with a digital filter contained in a D/A converter using a sampling function generally referred to as a sinc function. FIG. 16 is an explanatory graph of a sinc function. This sinc function is obtained when a Dirac delta function is inverse-Fourier-transformed, and is defined as sin (πft)/(πft) where the sampling frequency is f. This sinc function becomes one only at a sample point, where t=0, and zero at all other sample points.

Conventionally, an oversampling process is performed using a digital filter in which a waveform data of the sinc function is set to a tap counter of an FIR (finite impulse response) filter.

In the oversampling technology for performing an interpolating operation on discrete voice data using a digital filter, a low-pass filter having a moderate attenuation characteristic can be applied. Therefore, the phase characteristic with a low-pass filter can approach a linear phase characteristic, and the sampling aliasing noise can be reduced. Such an effect becomes more outstanding with a higher pseudo sampling frequency. However, when a sampling frequency rises, the processing speed of the digital filter and the sample holding circuit is also increased. Therefore, expensive parts applied in the high-speed process are required, thereby raising the entire parts cost. In addition, when a high sampling frequency (for example, several MHz) is necessary for image data, etc., a digital filter for oversampling and a sample holding circuit have to be mounted using parts operated around several ten MHz to several hundred MHz, which cannot be easily realized.

In addition, even when the oversampling technology is used, a smooth analog signal is generated by passing a staircase signal waveform through a low-pass filter. Therefore, when a low-pass filter is used, a linear phase characteristic in the strict sense cannot be expected. Furthermore, the above mentioned sinc function is a function converging to 0 at ±∞. Therefore, when a correct interpolation value is computed, all digital data values should be considered. However, for convenience of a circuit size, etc., the number of tap counters of a digital filter is set so as to the range of digital data to be taken into account is limited. Therefore, an obtained interpolation value contains a truncation error.

Thus, the conventional D/A converter using the oversampling technology requires parts for a high-speed operation to raise a pseudo sampling frequency, thereby incurring a high cost or realizing a necessary system with difficulty. Furthermore, the deterioration of the phase characteristic arises from using a low-pass filter, and a truncation error is contained because the digital filter to which a sinc function is applied is used. Therefore, distortion of output waveform according to the deterioration of the phase characteristic and the truncation error occurs.

SUMMARY OF THE INVENTION

The present invention has been developed based on the above mentioned problems, the object of the present invention is to provide a digital-analog converter capable of obtaining an output waveform with less distortion without increasing the speed of operating parts.

The digital-analog converter according to the present invention continuously generates an analog signal waveform corresponding to a sampling function of local support, synchronizes the generation of the signal waveform corresponding to the sampling function with the input timing of each piece of digital data, and adds the signal waveform obtained by amplifying the amplitude at a gain corresponding to the value of the digital data for n pieces of sequentially input digital data to generate a signal, thereby outputting continuous analog signals. Especially, to generate a signal waveform corresponding to each piece of digital data, it is desirable that a first generation unit includes the first delay unit and the amplifying unit for delaying and amplifying the signal waveform of a sampling function, and the first addition unit for adding the delayed and amplified signal waveform in an analog algorithm.

Since a final analog signal is output by generating an analog signal after performing a predetermined process such as an amplifying process, etc. on the continuously generated signal waveform of the sampling function, and since a low-pass filter is not used in outputting an analog signal, there is not the problem that the phase characteristic is deteriorated by variable phase characteristics depending on the frequency of a signal to be processed. In addition, since functions of local support are used as sampling functions, the number of pieces of digital data required to obtain an analog signal can be reduced. Furthermore, even when the number of pieces of digital data to be processed is reduced, no truncation error arises, thereby minimizing the distortion of an output waveform. In addition, as compared with the conventional oversampling method, it is not necessary to increase the speed of operating parts. Therefore, expensive parts are not required, and the parts cost can be successfully reduced.

In the sampling function generation unit generates continuous signal waveforms corresponding to the above mentioned sampling function, it is desirable that a B spline function generation unit generates a basic waveform corresponding to a B spline function, and a second generation unit generates a signal waveform by adding before or after the basic waveform on time axis an ancillary waveform obtained by attenuating and polarity-inverting the basic waveform. With the configuration and the operation of the sampling function generating unit, a signal waveform corresponding to a predetermined sampling function can be continuously obtained.

Especially, it is preferable to use a third order B spline function as the above mentioned B spline function, and as the sampling function, it is preferable to use a function, which can be differentiated only once over the whole range of local support. It is considered that it is necessary that various signals existing in the natural world have differentiability because the signals change smoothly. Nevertheless, it is considered that it is not necessary that the differentiability is not always infinite, and that it is possible to sufficiently approximate natural phenomena so long as the signals can be differentiated only once. Although there are many advantages such as smoothly interpolating sampling values, reducing the number of sampling values to be used in an interpolating process, etc., by using a sampling function of the local support that can be differentiated finite times, conventionally, it was considered that a sampling function fulfilling these conditions did not exist. Nevertheless, by the present inventor's research, a function fulfilling the conditions described above is found.

The sampling function H(t) is defined by $-F(t+1/2)/4+F(t)-F(t-1/2)/4$ where the third order B spline function is F(t). That is, by the definition equation, using a signal waveform of a third order B spline function, each signal waveform is generated after attenuating, polarity-inverting, and shifting on a time axis the signal waveform (actually a delay because forwarding on a time axis is not possible), thereby obtaining a signal waveform corresponding to the above mentioned sampling function H(t).

To generate the above mentioned signal waveform of a sampling function, the above mentioned second generation unit includes a first inverse amplifying unit for attenuating and polarity-inverting the basic waveform output from a B spline function generation unit, and outputting a first signal waveform; a second delay unit for delaying the basic waveform by a predetermined time and outputting a second signal waveform; and a second inverse amplifying unit and a third delay unit for attenuating, polarity-inverting, and delaying by a predetermined time the basic waveform, and outputting a third signal waveform. It is preferable that the first, second and third signal waveforms are added up in an analog algorithm by a second addition unit to generate a signal waveform. Especially, assuming that the generation time of a B spline function output from the B spline function generation unit is set as 3T, it is preferable that the delay times of the second and third delay units are set as T/2 and T respectively, and the amount of attenuation by the first and second inverse amplifying units are set to 1/4 respectively. By generating each output obtained by these inverse amplifying units and delay units, a signal processing operation can be performed by the definition equation of the above mentioned sampling function H(t), and a sampling function can be continuously generated based on the signal waveform of the third order B spline function.

Since a third order B spline function is used as the above mentioned sampling function H(t), a differentiating process can be performed only once, and the function is a function of a local support whose value converges to 0 at $t=\pm 2$, thereby satisfying the above mentioned two conditions. Using the function H(t), discrete data can be smoothly interpolated with a smaller amount of computation, thereby performing a high-precision interpolating process.

In addition, the B spline function generation unit includes a convolution operation unit for performing a convolution operation on i-order B spline function waveforms. By inputting to the convolution operation unit a triangular wave which is a signal waveform of the second order B spline function, the signal waveform of a third order B spline function can be easily generated and output.

The B spline function generation unit includes two cascade connected convolution operation units for performing a convolution operation on i-order B spline function waveforms. By inputting a rectangular wave which is the signal waveform of a first order B spline function to the convolution operation unit at the first stage, the signal waveform of the third order B spline function can be easily generated and output.

The B spline function generation unit includes three cascade connected convolution operation units for performing a convolution operation on i-order B spline function waveforms. By inputting a pulse string to the convolution operation unit at the first stage, the signal waveform of the third order B spline function can be easily generated and output.

Practically, it is preferable that the convolution operation unit includes a fourth delay unit and a third inverse amplifying unit for delaying by a predetermined time and polarity-inverting an input signal waveform, a third addition unit for adding up the delayed and polarity-inverted signal waveform and the input signal waveform in an analog algorithm to generate a signal waveform, and an integration unit for time-integrating the generated signal waveform. By performing the process by each unit, the convolution operation can be performed on i-order B spline function signal waveforms, and the signal waveform of the third order B spline function can be continuously output on a time axis from the integration unit contained in the convolution operation unit at the last stage.

BRIEF DESCRIPTION OF THE DRAWINGS

FIGS. 5A to 5D are explanatory graphs showing in detail the data interpolation performed using a sampling function according to an embodiment, FIG. 12 is a diagram showing the configuration of a rectangular wave generation circuit, FIGS. 13A to 13D are diagrams showing various signal waveforms of each unit of the rectangular wave generation circuit, FIG. 14 is a diagram showing the configuration of a triangular wave generation circuit, FIGS. 15A and 15B are diagrams showing the signal waveforms of each unit of the triangular wave generation circuit.

DESCRIPTION OF THE PREFERRED EMBODIMENTS

The D/A converter according to an embodiment of the present invention does not generate an analog signal through a sample holding circuit and a low-pass filter after performing an oversampling process using a digital filter, but it continuously generates an analog signal waveform corresponding to a sampling function, generates the analog signal waveforms whose number is equal to the number of pieces of input discrete data, thereby generating an analog signal waveform corresponding to the interpolation value. The D/A converter according to an embodiment of the present invention will be described below in detail by referring to the attached drawings.

Figure 1:
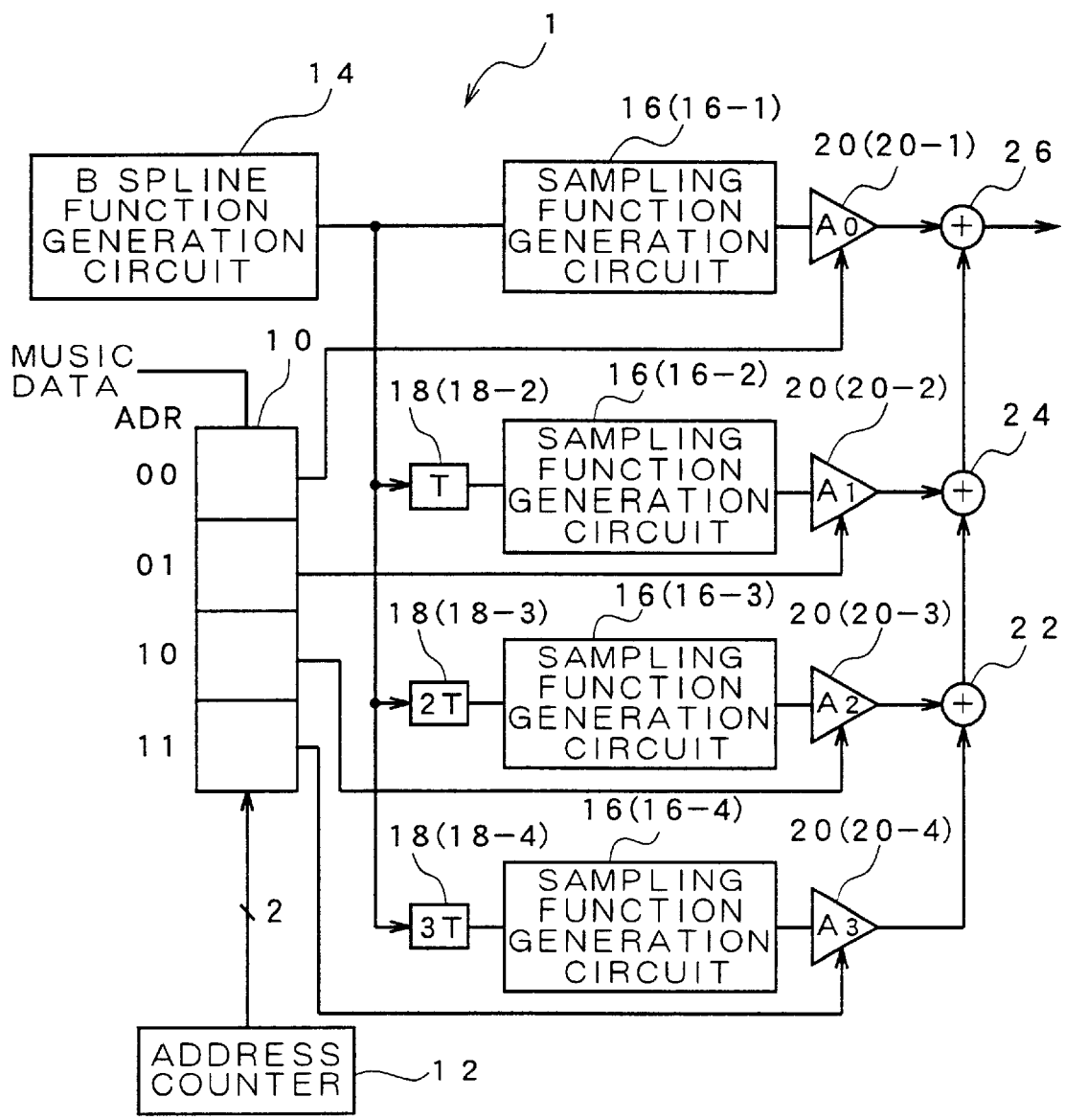
FIG. 1 is a diagram showing the configuration of the D/A converter according to an embodiment.

FIG. 1 shows the configuration of the D/A converter according to an embodiment of the present invention. A D/A converter 1 shown in FIG. 1 comprises memory 10, an address counter 12, a B spline function generation circuit 14, four sampling function generation circuits 16 (16-1, 16-2, 16-3, and 16-4), three delay circuits 18 (18-2, 18-3, and 18-4), four amplifiers 20 (20-1, 20-2, 20-3, and 20-4), and three adding circuits 22, 24, and 26. The configuration excluding the B spline function generation circuit 14 and the sampling function generation circuit 16 corresponds to the first generation unit.

Figure 2:
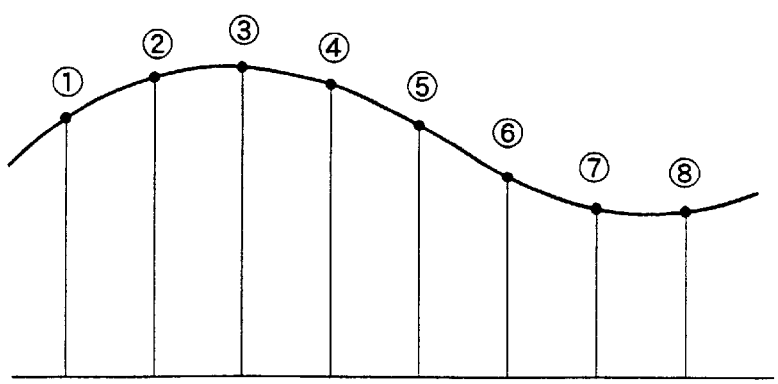
FIG. 2 is an explanatory diagram showing the order of discrete data input to the D/A converter.

The memory 10 has four storage regions, and cyclically stores four pieces of discrete digital data (for example, music data) input immediately before. For example, as shown in FIG. 2, when music data is input in order from ①, the first four pieces of music data ① to ④ are stored in the memory 10. When the next music data, that is, the fifth piece of the music data ⑤ is input, the first stored music data ① is overwritten by the fifth music data ⑤. Thus, each time new music data is input, the oldest music data is overwritten, thereby updating the stored data.

The address counter 12 is a 2-bit counter for generating an address of the memory 10. The 2-bit count value cyclically changes 00→01→10→11→00→ . . . in synchronization with the input timing (for example, the period of inputting the music data is set to T) of the music data.

The B spline function generation circuit 14 continuously generates an analog signal waveform corresponding to a third order B spline function. Each of the four sampling function generation circuits 16 continuously generates an analog signal waveform corresponding to a predetermined sampling function according to the signal waveform of the third order B spline function generated by the B spline function generation circuit 14. Its detailed configuration and the generated sampling function will be described later in detail.

The three delay circuits 18 delay and output a signal waveform output from the B spline function generation circuit 14 by a predetermined time, and input it to the sampling function generation circuit 16. Practically, the delay circuit 18-2 inputs a signal obtained by delaying by the time T the signal waveform output from the B spline function generation circuit 14 to the sampling function generation circuit 16-2. The delay circuit 18-3 inputs a signal obtained by delaying by the time 2T the signal waveform output from the B spline function generation circuit 14 to the sampling function generation circuit 16-3.

The delay circuit 18-4 inputs a signal obtained by delaying by the time 3T the signal waveform output from the B spline function generation circuit 14 to the sampling function generation circuit 16-4.

The four amplifiers 20 amplify the signal waveform output from the corresponding sampling function generation circuit 16 after a gain corresponding to the music data stored in each storage region of the memory 10 is set. Practically, the amplifier 20-1 multiplies the signal waveform output from the sampling function generation circuit 16-1 by A0 after the gain A0 corresponding to the music data stored in the address 00 of the memory 10 is set. The amplifier 20-2 multiplies the signal waveform output from the sampling function generation circuit 16-2 by A1 after the gain A1 corresponding to the music data stored in the address 01 of the memory 10 is set. The amplifier 20-3 multiplies the signal waveform output from the sampling function generation circuit 16-3 by A2 after the gain A2 corresponding to the music data stored in the address 02 of the memory 10 is set. The amplifier 20-4 multiplies the signal waveform output from the sampling function generation circuit 16-4 by A3 after the gain A3 corresponding to the music data stored in the address 03 of the memory 10 is set.

The three adding circuits 22, 24, and 26 add four signal waveforms output from each of the four amplifiers 20 in an analog algorithm. The adding circuit 22 adds up output signals from the amplifiers 20-3 and 120-4, the adding circuit 24 adds the addition result to the output signal of the amplifier 20-2, and then the adding circuit 26 further adds this addition result to the output signal of the amplifier 20-1.

The D/A converter 1 according to an embodiment of the present invention has the above mentioned configuration. Before explaining the operation, the outline of the sampling function generated by sampling function generation circuit 16 comprised in the D/A converter 1 according to the present embodiment, and the data interpolating process performed using the sampling function will be described below.

Figure 3:
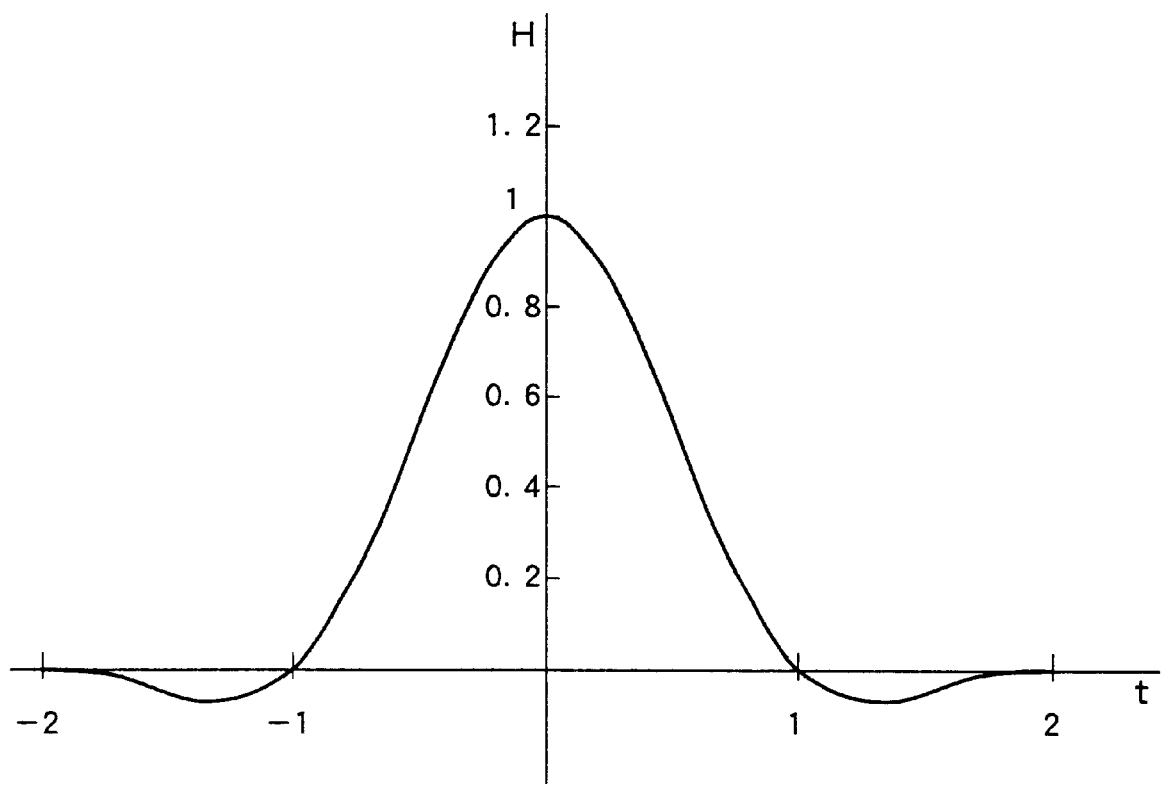
FIG. 3 is an explanatory graph of the sampling function applied in an embodiment.

FIG. 3 is the explanatory graph of the sampling function applied in the present embodiment. A sampling function H(t) shown in FIG. 3 is a function of a local support to which attention is paid on differentiability. For example, the function H(t) can be differentiated only once in the whole region and a function of a local support having finite values, which are not zeroes, when a sample position t along a horizontal axis is between −2 and +2. In addition, since being a sampling function, the function H(t) is characterized in that the function H(t) becomes one only at a sample point with t=0 and becomes zero at sample points with t=±1 and ±2.

In case where the sampling function generated by the sampling function generation circuit 16 applying this embodiment, as shown in FIG. 3, the sample point t on the horizontal axis and the value of the sampling function H on the vertical axis are corresponding to the time passage and the signal level of the output signal respectively. Detailed explanation of the generating operation of the signal waveform corresponding to the sampling function generated by the sampling function generation circuit 16 will be described later.

It is verified by the present inventor's investigation that a function H(t) fulfilling various conditions described above (a sampling function, one-time differentiability, and a local support) exists. Concretely, with letting a third order B spline function be F(t), such a sampling function H(t) can be defined as:

$$H(t)=-F(t+1/2)/4+F(t)-F(t-1/2)/4 \qquad (1)$$

Where the third order B spline function F(t) can be represented by the following equation.

$$\begin{cases} (4t^2+12t+9)/4; & -3/2 \le t < -1/2 \\ -2t^2+3/2; & -1/2 \le t < 1/2 \\ (4t^2-12t+9)/4; & 1/2 \le t < 3/2 \end{cases} \quad (2)$$

The sampling function generation circuit 16 according to the present embodiment produces a signal waveform corresponding to the sampling function H(t) by generating the signals of the signal waveforms of each term on the right side of the equation (1) produced individually.

The above-described sampling function H(t) is a quadric piecewise polynomial, and uses the third order B spline function F(t). Therefore, the function H(t) is a function of a local support that is guaranteed to be differentiable only once over the whole region. In addition, the function H(t) becomes zero at t=±1 and ±2.

In this manner, the above-described function H(t) is a sampling function and a function of a local support that can be differentiated only once over the whole region and converges to zero at t=2. Therefore, it is possible to perform interpolation of a value between discrete data using a function, which is differentiable only once, by performing convolution on the basis of respective discrete data using this sampling function H(t).

Figure 4:
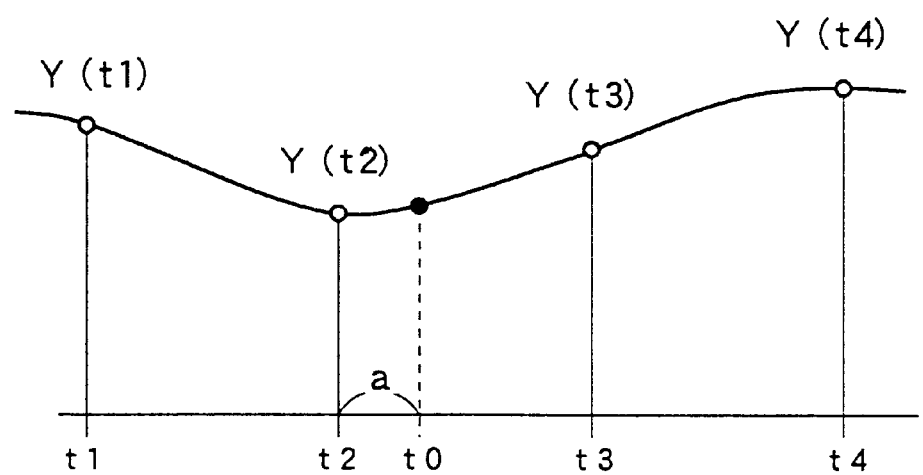
FIG. 4 is a diagram showing the relationship between discrete data and interpolation values between the discrete data.

FIG. 4 shows the relationship between discrete data and interpolation values between the discrete data. For example, discrete voice data can be obtained as sampling data by sampling a smoothly changing analog voice signal at constant time intervals, and quantizing the sampled signal. A D/A (digital-analog) converter of the present embodiment stores such discrete voice data, and outputs continuous analog voice signals obtained by supplementing the data in an interpolating process.

In FIG. 4, assuming that the values of the discrete data at the sample positions t1, t2, t3, and t4 at equal intervals are Y(t1), Y(t2), Y(t3), and Y(t4), the interpolation value y corresponding to a predetermined position to (distance a from t2) between the coordinates t2 and t3 is obtained as follows.

Generally, to obtain an interpolation value y using a sampling function, the value of a sampling function is obtained for each piece of the given discrete data at the position of the interpolation value y, and a convolution operation is performed using the obtained value. Since the sinc function converges to 0 at the sample point t=±∞, the interpolation value y can be correctly obtained only by computing the value of the sinc function at the position of the interpolation value y corresponding to each piece of discrete data up to t=±∞, and then performing the convolution operation using the computation result.

However, since the sampling function H (t) used in the present embodiment converges to 0 at the sampling point t=±2, the discrete data up to t=±2 should be taken into account. Therefore, when the interpolation value y shown in FIG. 4 is to be computed, only the values Y(t1), Y(t2), Y(t3), and Y(t4) of the four pieces of discrete data corresponding to t=t1, t2, t3, and t4 are to be taken into account, thereby considerably reducing the amount of processing. Additionally, there are no truncation errors occurring for each piece of discrete data where t≧±3 because there is logically no need of considering the data, not because the data is ignored in consideration of the amount of processing and necessary precision.

FIGS. 5A to 5D show in detail the data interpolation performed using a sampling function according to the present embodiment. The procedure of the interpolating process is, for each sampling position as shown in FIGS. 5A to 5D, to set equal the peak values at t=0 (center position) of the sampling functions H(t) shown in FIG. 3, where the values of the sampling functions H(t) at respective interpolation positions t0 are obtained.

For example, the value Y(t1) of the discrete data at t1 shown in FIG. 5A will be concretely described below. The distance between the interpolation position t0 and the sampling position t1 is 1+ a by normalizing the distance between the sampling positions and setting it to 1. Therefore, the value of the sampling function at the interpolation position to is H (1+a) when the center position of the sampling function H(t) is aligned with the sample position t1. Actually, since the peak value at the center position of the sampling function H(t) is set so as to coincide with the value Y(t1) of the discrete data, a value to be obtained is the value H (1+a)·Y(t1) computed by multiplying the above mentioned H (1+a) by Y(t1).

The sampling function generation circuit 16-1 included in the D/A converter according to the present embodiment continuously generates the waveform of the sampling function H(t) shown in FIG. 3. Therefore, based on the generation start position of a signal (the position of t=−2 in FIG. 3, and matching in timing of starting outputting the signal waveform of the B spline function from the B spline function generation circuit 14), the output level at the time (3+a) after the starting time matches the value H (1+a) of the sampling function at t=1+a. When a value obtained by multiplying the H (1+a) by Y(t1) is computed, the output of the sampling function generation circuit 16 is amplified by the amplifier 20-1 having the gain Y (t1) (A=0).

Similarly, the signal waveform output from the B spline function generation circuit 14 is passed through each delay circuit 18-2 to 18-4, and each sampling function generation circuit 16 generates the signal waveforms of the three sampling functions whose generation starting time is respectively delayed in each time T, 2T, 3T. Each signal is amplified by each of the amplifiers 20-2, 20-3, 20-4 having the gains of ·Y(t2)(=A1), ·Y(t3) (=A2), and ·Y(t4) (=A3), thereby obtaining the values H(a)·Y(t2), H(1-a)·Y(t3), H(2-a)·Y(t4) corresponding to the interpolation position t0 shown in FIGS. 5B to 5D at the same timing which obtained the above value H(1+a)·Y(t1).

Thus, the values H(1+a).Y(t1), H(a).Y(t2), H(1-a).Y(t3), H(2-a).Y(t4) output simultaneously from each four amplifiers 20 at a predetermined timing are added by adding circuits 22, 24, 26 and the interpolation value y (t0) at the timing can be obtained.

In addition, although the interpolation position t0 is shifted with time, the level of the signal waveforms output from each four sampling function generation circuits 16 also change with time. Therefore, the interpolation valuey (t0) also changes continuously, and continuous analog signals smoothly connecting discrete data can be obtained.

Especially, since continuous interpolation values can be obtained by amplifying at a predetermined gain corresponding to discrete data (digital data) the signal waveforms of the four sampling functions generated at different starting timings, and adding the signal waveforms, the conventional sample holding circuit or low-pass filter are not required. Therefore, the linear phase characteristic is not deteriorated. Furthermore, since the sampling function H(t) of local support converging to 0 in the range of t=±2 is used, only four pieces of discrete data are used to perform the interpolating process, thereby reducing the amount of processing. Additionally, since a truncation error does not occur, an output waveform can be obtained with less distortion. Moreover, since no oversampling process is performed as in the conventional method, only a predetermined operation speed depending on the time intervals of input discrete data. Consequently, it is not required the performing a high-speed signal process, thereby requiring no expensive parts.

Described below will be the operation of generating a signal waveform by the above mentioned sampling function generation circuit 16.

Figure 6:
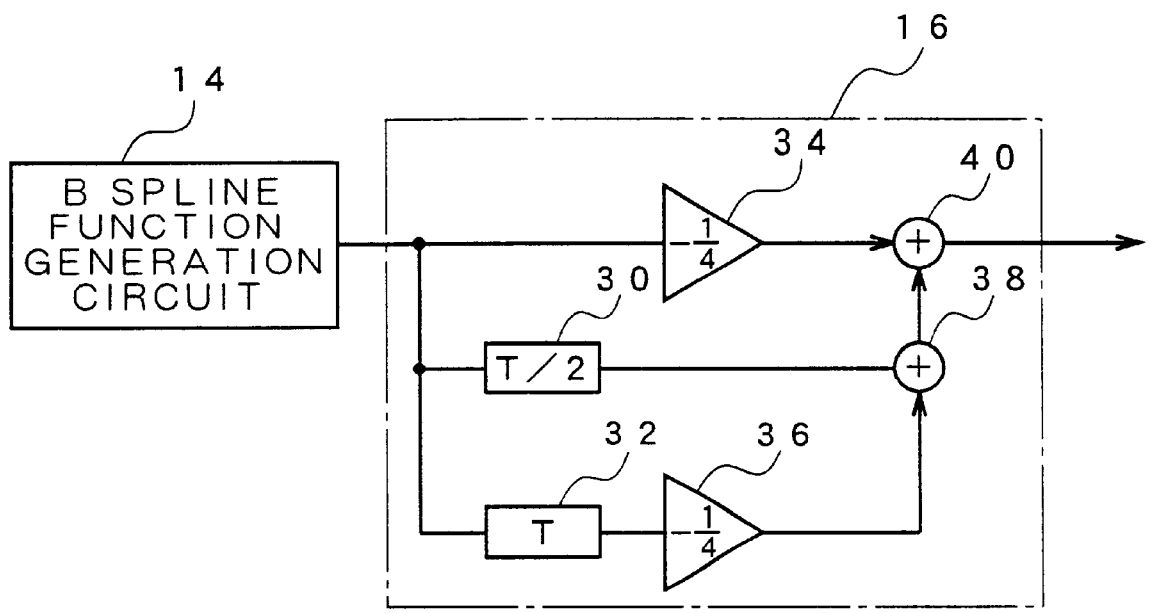
FIG. 6 is a diagram showing the configuration of the sampling function generation circuit according to an embodiment.

FIG. 6 shows the configuration of the sampling function generation circuit 16 according to an embodiment. A sampling function generation circuit 16 shown in FIG. 6 comprises delay circuits 30 and 32, inverting amplifiers 34 and 36, and adding circuits 38 and 40.

The delay circuit 30 delays by a predetermined time (T/2) and outputs a signal waveform output from the B spline function generation circuit 14. Another delay circuit 32 delays by a predetermined time (T) and outputs the signal waveform output from the B spline function generation circuit 14. The inverting amplifiers 34 and 36 attenuate the level of an input signal down to 1/4, and polarity-invert and output the resultant signal. To one inverting amplifier 34, the signal waveform output from the B spline function generation circuit 14 is directly input. To another inverting amplifier 36, a signal obtained by passing a signal waveform output from the B spline function generation circuit 14 through the delay circuit 32 is input. The two adding circuits 38 and 40 add up the three signal waveforms respectively output from the delay circuit 30, and the two inverting amplifiers 34 and 36 in an analog algorithm. The adding circuit 38 adds up the output from the delay circuit 30 and the inverting amplifier 36, then this additional result and the output signal from the inverting amplifier 34 are added by another adding circuit 40.

Figure 7A:
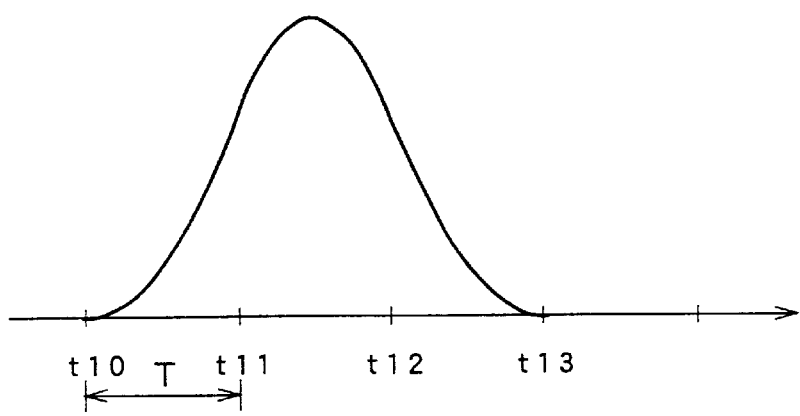
FIGS. 7A to 7E are diagrams showing signal waveforms of each unit of the sampling function generation circuit.

FIGS. 7A to 7E show signal waveforms input to or output from each unit of the sampling function generation circuit 16. FIG. 7A shows the signal waveform (basic waveform) output from the B spline function generation circuit 14, and corresponds to the waveform of the third order B spline function expressed by the piecewise polynomial of the equation (2). The output signal is a waveform of local support having a predetermined value until the time t13 after the time lapse of 3T where T indicates the input time interval of discrete data, t10 indicates the signal generation time (generation timing).

Figure 7B:
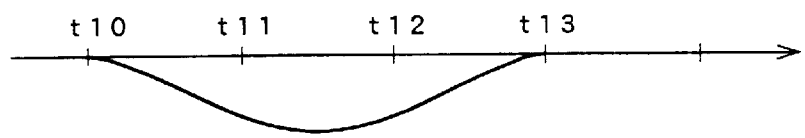

FIG. 7B shows the signal waveform (first signal waveform) output from the inverting amplifier 34, and shows the ancillary waveform obtained by polarity-inverting and attenuating to 1/4 the basic waveform output from the B spline function generation circuit 14 by passing it through the inverting amplifier 34.

Figure 7C:
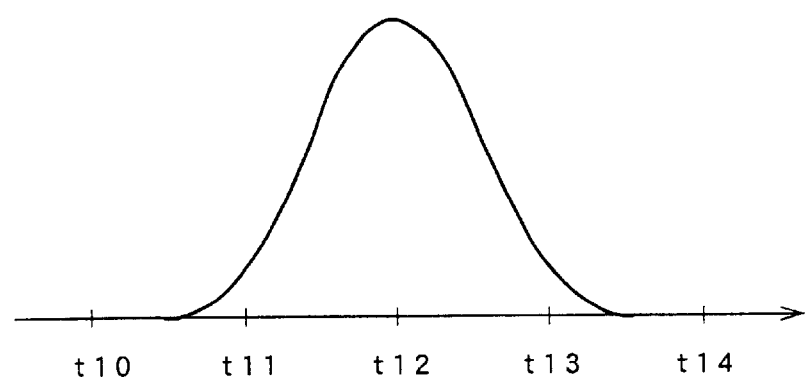

FIG. 7C shows the signal waveform (second signal waveform) output from the delay circuit 30, and shows the signal waveform obtained by delaying the basic waveform output from the B spline function generation circuit 14 by a half (T/2) of the input time interval T of discrete data by passing it through the delay circuit 30.

Figure 7D:
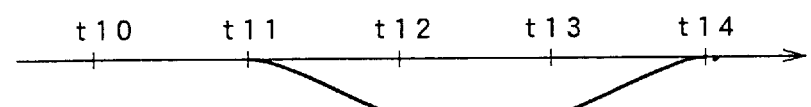

FIG. 7D shows the signal waveform (third signal waveform) output from the inverting amplifier 36, and shows the ancillary waveform obtained by polarity-inverting and attenuating the signal level to 1/4 after delaying the signal by a time length equal to the input time interval T of discrete data by passing the basic waveform output from the B spline function generation circuit 14 through the delay circuit 32 and the inverting amplifier 36.

Figure 7E:
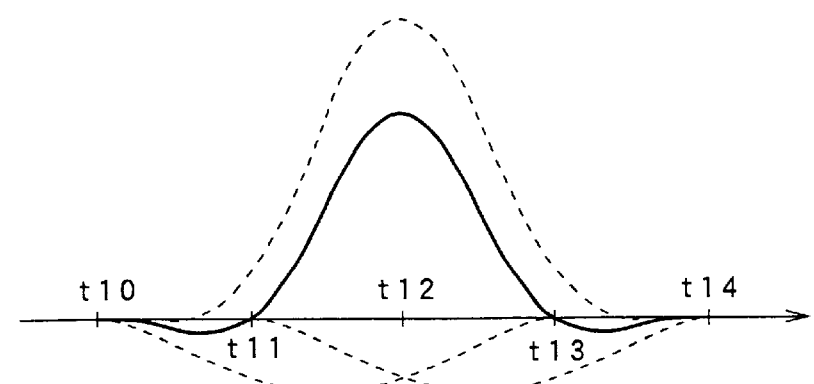

Thus, by generating a signal by adding up the signal waveforms (signal waveforms shown in FIGS. 7B, 7C, and 7D) output from the two inverting amplifiers 34 and 36, and the delay circuit 30 by the adding circuits 38 and 40 in an analog algorithm, the signal waveform shown in FIG. 7E can be obtained. The signal waveform is the same as the signal waveform shown in FIG. 3, and the sampling function, where the signal level continuously changes with time within the time t10 to t14, according to the present embodiment can be generated.

Figure 8:
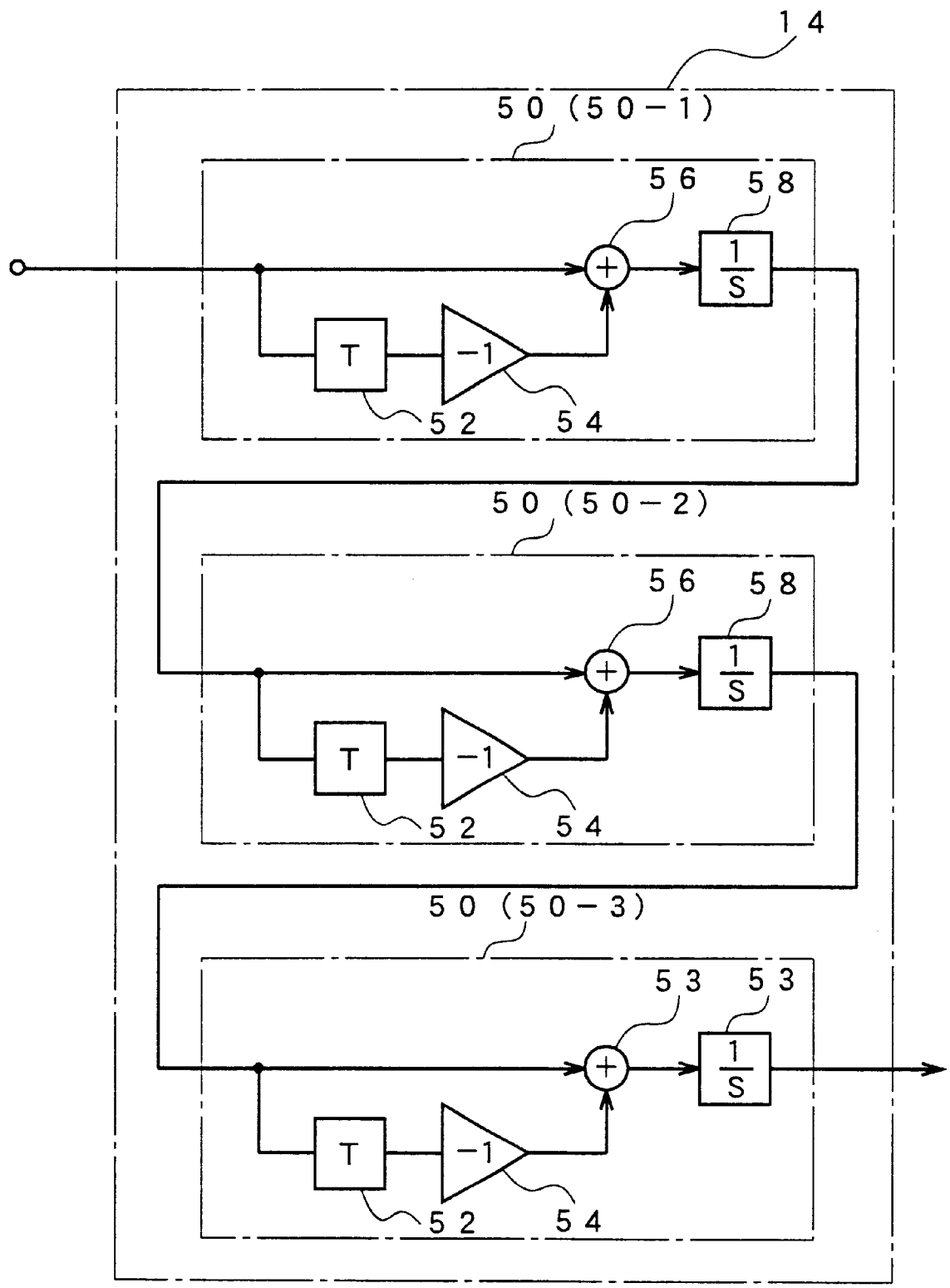
FIG. 8 is a diagram showing the practical configuration of the B spline function generation circuit.

FIG. 8 shows the practical configuration of the B spline function generation circuit 14 contained in the D/A converter 1 according to the present embodiment. The B spline function generation circuit 14 shown in FIG. 8 comprises three cascade connected convolution operation circuits 50 (50-1, 50-2, and 50-3) having the same configurations.

Each of the convolution operation circuits 50 generates and outputs a signal waveform corresponding to the (i+1)-order B spline function by performing a convolution operation on i-order B spline functions when the signal waveform of the i-order B spline function is input.

The convolution operation circuit 50-1 at the first stage receives a pulse string having the period of 4T, and generates and outputs a rectangular wave, that is, the first order B spline function. The convolution operation circuit 50-2 at the second stage receives a signal wave form (rectangular wave) corresponding to the first order B spline function output from the convolution operation circuit 50-1 at the first stage, and generates and outputs a triangular wave, that is, the second order B spline function. The convolution operation circuit 50-3 at the third stage receives a signal waveform (triangular wave) corresponding to the second order B spline function output from the convolution operation circuit 50-2 at the second stage, and outputs a signal waveform shown in FIG. 7A, that is, the third order B spline function.

Each of the convolution operation circuits 50 comprises a delay circuit 52, an inverting amplifier 54, an adding circuit 56, and an integration circuit 58. The delay circuit 52 delays the signal waveform of the input i-order B spline function by a predetermined time T. The inverting amplifier 54 polarity-inverts an input signal, and inverts the polarity of the signal waveform of the i-order B spline function output from the delay circuit 52. The adding circuit 56 adds in an analog algorithm an input signal waveform of the i-order B spline function to the signal waveform of the i-order B spline function whose polarity is inverted after the time delay of T by passing it through the delay circuit 52 and the inverting amplifier 54. The integration circuit 58 time-integrates a signal waveform output from the adding circuit 56.

Figure 9A:
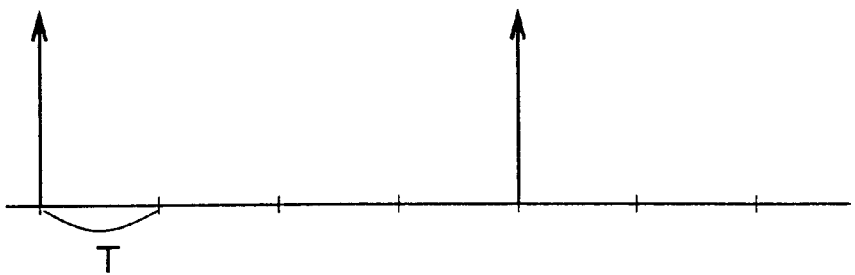
FIGS. 9A to 9C are diagrams showing the signal waveforms of each unit of the convolution operation circuit at the first stage.
Figure 9B:
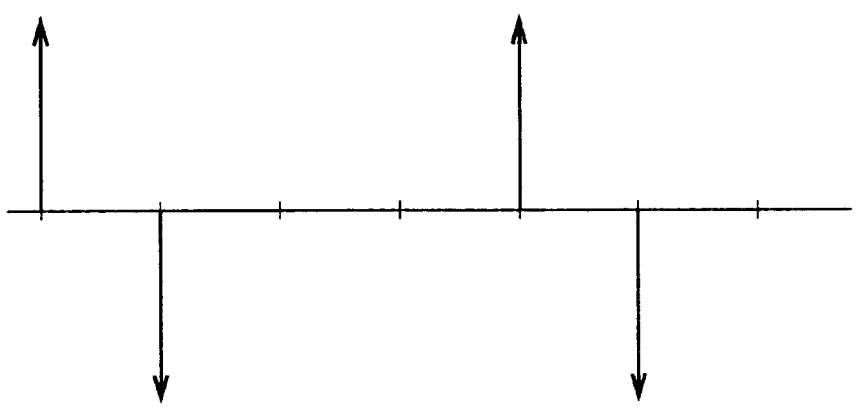
Figure 9C:
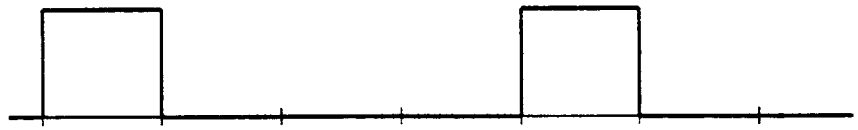

Described below will be the operations of the convolution operation circuits 50 at respective stages. FIGS. 9A to 9C show the signal waveforms input to and output from each unit of the convolution operation circuit 50-1 at the first stage. When a pulse of a period of 4T shown in FIG. 9A is input to the convolution operation circuit 50-1, the input signal is added to the signal obtained by delaying by the period of T and polarity-inverting the input signal. Therefore, the adding circuit 56 outputs a signal in which pulses of different polarities are alternately arranged as shown in FIG. 9B. Accordingly, by integrating the signal by the integration circuit 58, a rectangular wave having the period of 4T and the duty ratio of 25% as shown in FIG. 9C is output.

Figure 10A:
FIGS. 10A to 10C are diagrams showing the signal waveforms of each unit of the convolution operation circuit at the second stage.
Figure 10B:
Figure 10C:

FIGS. 10A to 10C show the signal waveforms input to and output from each unit of the convolution operation circuit 50-2 at the second stage. When the rectangular wave having the period of 4T and the duty ratio of 25% as shown in FIG. 10A is input to the convolution operation circuit 50-2, the input rectangular wave is added to the signal obtained by delaying by the period of T and polarity-inverting the rectangular wave. Therefore, the adding circuit 56 outputs a signal in which rectangular waves of different polarities are alternately arranged as shown in FIG. 10B. Accordingly, by integrating the signal by the integration circuit 58, a partially triangular wave having the period of 4T as shown in FIG. 10C is output.

Figure 11A:
FIGS. 11A to 11C are diagrams showing the signal waveforms of each unit of the convolution operation circuit at the third stage.
Figure 11B:
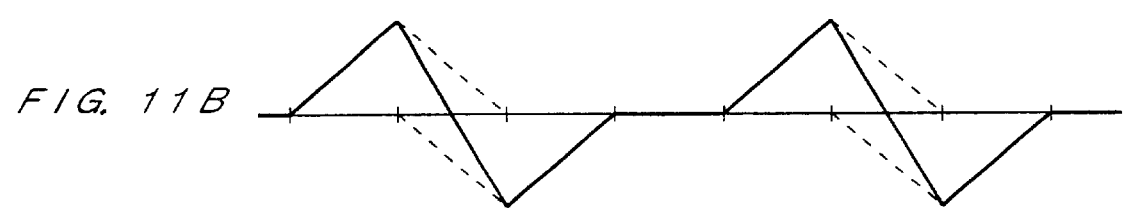
Figure 11C:
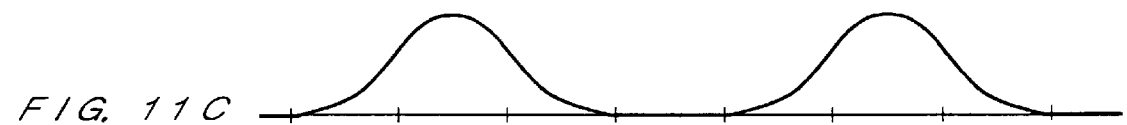
Figure 16:
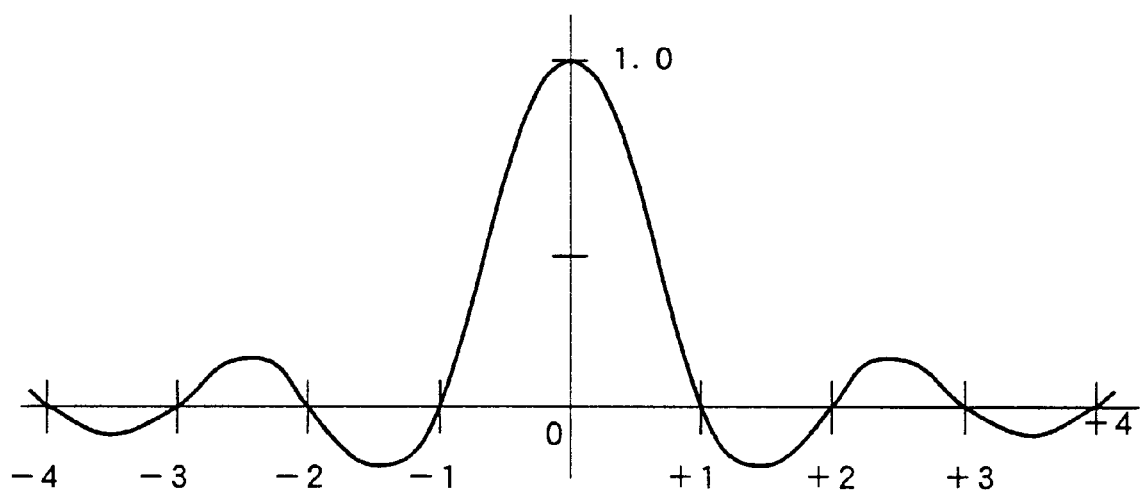
FIG. 16 is an explanatory graph of a sinc function.

FIGS. 11A to 11C show the signal waveforms input to and output from each unit of the convolution operation circuit 50-3 at the third stage. When the triangular wave shown in FIG. 11A is input to the convolution operation circuit 50-3, the input signal is added to the signal obtained by delaying by the period of T and polarity-inverting the signal. Therefore, the adding circuit 56 outputs the signal shown in FIG. 11B. Accordingly, by integrating the output signal by the integration circuit 58, the third order B spline function signal shown in FIG. 11C is obtained.

Thus, the B spline function generation circuit 14 according to the present embodiment can continuously generate a signal waveform of a third order B spline function with a simple configuration.

In the explanation of the B spline function generation circuit 14 shown in FIG. 8, a pulse string is input to the convolution operation circuit 50-1 at the first stage. However, as a signal to be actually input externally, the rectangular wave as shown in FIG. 10A and the triangular wave as shown in FIG. 11A can be more easily generated. Therefore, the signals can be input to the convolution operation circuit 50-2 at the second stage or the convolution operation circuit 50-3 at the third stage.

FIG. 12 shows the configuration of a rectangular wave generation circuit 60 for generating a rectangular wave to be input to the convolution operation circuit 50-2 at the second stage. The rectangular wave generation circuit 60 shown in FIG. 12 comprises a 2-bit counter 62 and an AND gate 64. A clock signal having a period of T is input to the clock terminal of the 2-bit counter 62. Each of the bits Q0 and Q1 of the output terminal of the 2-bit counter 62 is connected to the respective input terminals of the AND gate 64. A rectangular wave output from the AND gate 64 is input to the reset terminal R (negative logic) of the 2-bit counter 62, retrieve as an output of the rectangular wave generation circuit 60, and input to the convolution operation circuit 50-2 at the second stage shown in FIG. 8. The 2-bit counter 62 described above performs the same counting operation as the address counter 12 shown in FIG. 1. Therefore, one of them can be used commonly, and the other can be deleted.

FIGS. 13A to 13D show various signal waveforms input to and output from each unit of the rectangular wave generation circuit 60 shown in FIG. 12. When the 2-bit counter 62 receives a clock signal having a period of T as shown in FIG. 13A, it performs a counting operation in synchronization with the rise of the clock signal, and outputs the rectangular waves shown in FIGS. 13B and 13C respectively from the low order bit Q0 and the high order bit Q1 of the output terminal. The AND gate 64 obtains a logic product of the signals output from each of the bits Q0 and Q1 of the output terminal of the 2-bit counter 62, and obtains a rectangular wave having a period of 4T and a duty ratio of 25% as shown in FIG. 13D as an output of the rectangular wave generation circuit 60.

When a rectangular wave output from the rectangular wave generation circuit 60 is input to the convolution operation circuit 50-2 at the second stage of the B spline function generation circuit 14, the convolution operation circuit 50-1 at the first stage is not required. Therefore, it can be deleted from the circuit configuration shown in FIG. 8.

FIG. 14 shows the configuration of a triangular wave generation circuit 70 for generating a triangular wave to be input to the convolution operation circuit 50-3 at the third stage. FIGS. 15A and 15B also show the signal waveforms to be input to and output from each unit of the triangular wave generation circuit 70 shown in FIG. 14. The triangular wave generation circuit 70 shown in FIG. 14 comprises a hysteresis comparator 72 and an integrator 74 to generate a triangular wave shown in FIG. 15A, retrieves only the positive polarity of the triangular wave using a diode 76, and obtains a partial triangular wave shown in FIG. 15B as an output of the triangular wave generation circuit 70.

Since the triangular wave output of the positive polarity equal to or lower than the voltage in the forward direction is cut off when the diode 76 is used, it is desirable that, for example, a comparator whose threshold is set to 0V and an analog switch whose ON/OFF state is set by the output of the comparator are used in combination to correctly retrieve a triangular wave equal to or higher than 0V so that the element of 0V or higher of the triangular wave signal output from the integrator 74 can be extracted. In addition, when a triangular wave output from the triangular wave generation circuit 70 is input to the convolution operation circuit 50-3 at the third stage of the B spline function generation circuit 14, the convolution operation circuits 50-1 and 50-2 at the first and second stages are not required. Therefore, they can be deleted from the circuit configuration shown in FIG. 8.

The present invention is not limited to the above mentioned embodiments, but various other embodiments can be applied in the range of the gist of the present invention. For example, in the sampling function generation circuit 16 shown in FIG. 6, the inverting amplifier 36 is connected after the delay circuit 32, but this connection order can be inverted. Similarly, in each of the convolution operation circuits 50 contained in the B spline function generation circuit 14 shown in FIG. 8, the inverting amplifier 54 is connected after the delay circuit 52, but the connection order can also be inverted. Furthermore, the connection order of the delay circuit 18, the sampling function generation circuit 16, and the amplifier 20 contained in the D/A converter 1 shown in FIG. 1 can be variable, and the order can be appropriately changed as necessary.

According to the embodiment described above, the D/A converter 1 is designed to comprise four sampling function generation circuits 16-1 through 16-4 corresponding to four respective pieces of input digital data as shown in FIG. 1. However, the delay circuit 18 can be exchanged in order, that is, when each of the sampling function generation circuits 16 is connected before the delay circuit 18, signal waveforms are output at the same timings from each of the sampling function generation circuits 16. Therefore, the signal waveforms output from the common sampling function generation circuit 16 can be collectively input to the amplifier 20 and the three delay circuits 18.

Industrial Applicability

As described above, according to the present invention, since a final analog signal is output by generating an analog signal after performing a predetermined process such as an amplifying process, etc. on the continuously generated signal waveform of the sampling function, and since a low-pass filter is not used in outputting an analog signal, there is not the problem that the phase characteristic is deteriorated by variable phase characteristics depending on the frequency of a signal to be processed. In addition, since functions of local support are used as sampling functions, the number of pieces of digital data required to obtain an analog signal can be reduced. Furthermore, even when the number of pieces of digital data to be processed is reduced, no truncation abort error arises, thereby minimizing the distortion of an output waveform. In addition, as compared with the conventional oversampling method, it is not necessary to increase the speed of operating parts. Therefore, expensive parts are not required, and the parts cost can be successfully reduced.

What is claimed is:

1. The digital-analog converter, comprising:

a sampling function generation unit continuously generating an analog signal waveform corresponding to a sampling function of local support; and a first generation unit shifting a generation time of the sampling function corresponding to each of n pieces of digital data sequentially input at predetermined intervals, amplifying the sampling function before or after the shift by a gain depending on a value of the corresponding digital data, and generating a signal by adding up amplified outputs in an analog algorithm, wherein said sampling function generation unit which continuously generates a signal waveform corresponding to said sampling function, comprises:

a B spline function generation unit continuously generating a signal waveform corresponding to a B spline functions;

a second generation unit generating a signal waveform by adding an ancillary waveform obtained by attenuating and polarity-inverting a basic waveform before and after the basic waveform on a time axis when a signal waveform output from said B spline function generation unit is deffined as the basic waveform.

2. The digital-analog converter according to claim 1, wherein;

said B spline function is a third order B spline function; and said sampling function is a function that can be differentiated only once over the whole region.

3. The digital-analog converter according to claim 2, wherein said sampling function can be defined by $H(t)=-F(t+1/2)/4+F(t)-F(t-1/2)/4$ where said third order B spline function is represented by $F(t)$.

4. The digital-analog converter according to claim 3, wherein said third order B spline function $F(t)$ can be represented by $(4t^2+12t+9)/4$ for $-3/2 \leq t < -1/2$, $-2t^2+3/2$ for $-1/2 \leq t < 1/2$, and $(4t^{2-12}t+9)/4$ for $1/2 \leq t < 3/2$.

5. The digital-analog converter according to claim 1, wherein said second generation unit comprises:

a first inverse amplifying unit attenuating and polarity-inverting the basic waveform output from said B spline function generation unit to output a first signal waveform;

a second delay unit outputting a second signal waveform by delaying the basic waveform by a predetermined time;

a second inverse amplifying unit and a third delay unit attenuating, polarity-inverting, and delaying by a predetermined time the basic waveform to output a third signal waveform; and a second addition unit adding up the first, second and third signal waveforms in an analog algorithm to generate a signal waveform.

6. The digital-analog converter according to claim 5, wherein:

when a generation time of the B spline function by said B spline function generation unit is 3T, a delay time of said second delay unit is set to T/2, and a delay time of said third delay unit is set to T; and an amount of attenuation by said first and second inverse amplifying units are set to 1/4.

7. The digital-analog converter according to claim 1, wherein said B spline function generation unit comprises a convolution operation unit for performing a convolution operation on i-order B spline functions, and continuously outputs a signal waveform of a third order B spline function by inputting to said convolution operation unit a signal waveform of a second order B spline function.

8. The digital-analog converter according to claim 7, wherein said convolution operation unit comprise:

a fourth delay unit and a third inverse amplifying unit delaying and polarity-inverting an input signal waveform by a predetermined time;

a third addition unit generating a signal waveform by adding a delayed and polarity-inverted signal waveform output from said fourth delay unit or said third inverse amplifying unit to said input signal waveform in an analog algorithm; and an integration unit time-integrating a signal waveform output from said third addition unit.

9. The digital-analog converter according to claim 1, wherein said B spline function generation unit comprises two cascade connected convolution operation units for performing a convolution operation on i-order B spline functions, and continuously outputs a signal waveform of a third order B spline function from the subsequent stage of said convolution operation unit by inputting to first stage of said convolution operation unit a signal waveform of a first order B spline function.

10. The digital-analog converter according to claim 9, wherein said convolution operation unit comprises:

a fourth delay unit and a third inverse amplifying unit delaying and polarity-inverting an input signal waveform by a predetermined time;

a third addition unit generating a signal waveform by adding a delayed and polarity-inverted signal waveform output from said fourth delay unit or said third inverse amplifying unit to said input signal waveform in an analog algorithm; and an integration unit time-integrating a signal waveform output from said third addition unit.

11. The digital-analog converter according to claim 1, wherein said B spline function generation unit comprises three cascade connected convolution operation units for performing a convolution operation on i-order B spline functions, and continuously outputs a signal waveform of a third order B spline function from the final stage of said convolution operation unit by inputting to first stage of said convolution operation unit pulse strings.

12. The digital-analog converter according to claim 11, wherein said convolution operation unit comprises:

a fourth delay unit and a third inverse amplifying unit delaying and polarity-inverting an input signal waveform by a predetermined time;

a third addition unit generating a signal waveform by adding a delayed and polarity-inverted signal waveform output from said fourth delay unit or said third inverse amplifying unit to said input signal waveform in an analog algorithm; and an integration unit time-integrating a signal waveform output from said third addition unit.

\* \* \* \* \*